(12) United States Patent
Mitchell et al.

(10) Patent No.: US 7,006,943 B1
(45) Date of Patent: Feb. 28, 2006

(54) METHOD AND APPARATUS FOR USING AN ON-BOARD TEMPERATURE SENSOR ON AN INTEGRATED CIRCUIT

(75) Inventors: Charles W. Mitchell, Austin, TX (US); Patrick Maupin, Austin, TX (US); Dervinn Caldwell, Freemont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 90 days.

(21) Appl. No.: 09/660,209

(22) Filed: Sep. 12, 2000

(51) Int. Cl.
*G08B 17/00* (2006.01)

(52) U.S. Cl. ................................ 702/132
(58) Field of Classification Search ............... 702/132, 702/107; 257/467, 417, 426; 438/54; 219/492; 222/146; 34/97; 374/176, 169; 315/119; 340/584; 399/69; 700/29, 121; 347/169, 347/50, 14; 358/1–9; 324/698, 539; 235/462; 361/1
See application file for complete search history.

(56) References Cited

U.S. PATENT DOCUMENTS

| | | | |
|---|---|---|---|
| 4,289,272 A * | 9/1981 | Murase et al. ............... 165/257 |
| 5,422,806 A * | 6/1995 | Chen et al. .................... 700/29 |
| 5,996,084 A * | 11/1999 | Watts ........................ 713/323 |
| 6,104,075 A * | 8/2000 | Karaki ........................ 257/467 |
| 6,131,073 A * | 10/2000 | Honda et al. ................ 702/707 |
| 6,172,611 B1 * | 1/2001 | Hussain et al. ............. 340/584 |
| 6,198,245 B1 * | 3/2001 | Du et al. ..................... 318/471 |
| 6,415,388 B1 * | 7/2002 | Browning et al. ........... 713/322 |

OTHER PUBLICATIONS

MAX1617, Remote/Local Temperature Sensor with SMBus Serial Interface, Maxim Integrated Products Data Sheet, 19-1265; Rev. 1; Mar. 1998, 20 pages.

Virtex™ 2.5V Field Programmable Gate Arrays, Xilinx Final Product Specification, DS003 (v.2.2) May 23, 2000, 72 pages.

* cited by examiner

*Primary Examiner*—John Barlow
*Assistant Examiner*—Tung Lau
(74) *Attorney, Agent, or Firm*—Zagorin O'Brien Graham LLP

(57) ABSTRACT

An integrated circuit such as a processor measures its own temperature with a temperature sensor. The measured temperature is compared to an upper limit value stored in the integrated circuit. An output terminal of the integrated circuit is asserted according to the comparison. In one mode of operation, the output terminal is asserted when the measured temperature is greater than the upper limit value and deasserted when the measured temperature goes below a lower limit value. A second output terminal is asserted when the temperature is above a second upper limit value, thereby indicating that temperature has exceeded a safe limit.

12 Claims, 2 Drawing Sheets

US 7,006,943 B1

METHOD AND APPARATUS FOR USING AN ON-BOARD TEMPERATURE SENSOR ON AN INTEGRATED CIRCUIT

BACKGROUND OF THE INVENTION

1. Field of the Invention

This invention relates to integrated circuits and systems and more particularly to use of a temperature sensor on an integrated circuit.

2. Description of the Related Art

Computer systems have typically relied on external temperature sensors located in the proximity of the processor package to provide temperature information for thermal control. The external temperature sensor provides the temperature information to logic external to the processor, which utilizes the sensed temperature to provide appropriate thermal control functions, e.g., turning a fan on and off.

It would be desirable to incorporate temperature sensing directly onto the integrated circuit whose temperature is being measured to provide a more accurate temperature measurement of the integrated circuit die. Further, it would be desirable to provide appropriate logic on the same integrated circuit whose temperature is being measured to evaluate that temperature measurement and provide appropriate signals capable of being utilized to provide thermal control functions directly or indirectly.

SUMMARY OF THE INVENTION

Accordingly, in one embodiment, the invention provides an integrated circuit that includes a temperature sensor providing a temperature of the integrated circuit. A storage location on the integrated circuit stores a first temperature limit value. Compare logic is coupled to provide an indication of a comparison between the temperature and the first temperature limit value. In one embodiment, the integrated circuit asserts a temperature control signal on a first output terminal when the temperature indicated by the temperature sensor is above the first temperature limit value.

In an embodiment, there are two modes of operation which can be specified to deassert the temperature control signal. In one mode, the integrated circuit deasserts the temperature control signal supplied on the first output terminal when the temperature indicated by the temperature sensor falls below a programmable second temperature limit value. In another mode, integrated circuit deasserts the temperature control signal supplied on the first output when a control location in the integrated circuit is accessed. The integrated circuit may further include an addressable storage location coupled to the temperature sensor, which supplies an indication of the temperature on the integrated circuit.

The integrated circuit may further include a second output terminal coupled to provide external to the integrated circuit an asserted signal when the temperature indicated by the temperature sensor is above a second temperature limit value.

In another embodiment, the invention provides a method that includes, measuring a temperature of an integrated circuit with a temperature sensor, the temperature sensor being part of the integrated circuit; comparing the measured temperature to a first temperature limit value stored in the integrated circuit; and generating a signal on a first output terminal of the integrated circuit according to the comparison. In one embodiment, the signal is asserted when the measured temperature is greater than the first temperature limit value. In one embodiment, the first signal on the output terminal is deasserted when a control location on the integrated circuit is accessed or when the measured temperature goes below a lower limit value, according to a programmable mode of operation.

The method may further include comparing the measured temperature to a second temperature limit value stored in the integrated circuit; and asserting a second signal on a second output terminal of the integrated circuit when the measured temperature is above the second temperature limit value, thereby indicating that temperature has exceeded a safe limit.

BRIEF DESCRIPTION OF THE DRAWINGS

The present invention may be better understood, and its numerous objects, features, and advantages made apparent to those skilled in the art by referencing the accompanying drawings where the use of the same reference symbols in different drawings indicates similar or identical items.

DESCRIPTION OF THE PREFERRED EMBODIMENT(S)

Figure 1:
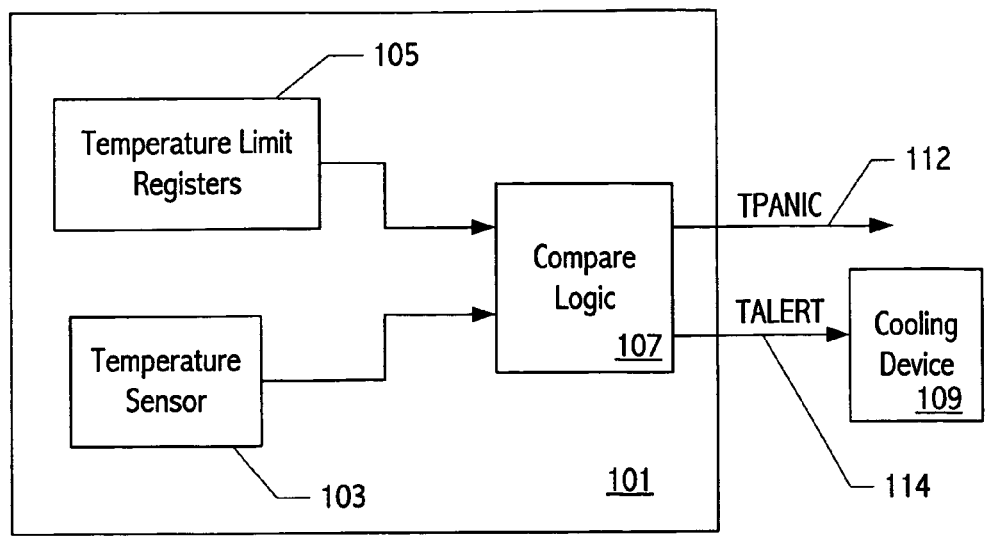
FIG. 1 illustrates a high level block diagram of an exemplary system incorporating an embodiment of the present invention.

Referring to FIG. 1, a high level block diagram of an exemplary computer system is illustrated that incorporates an embodiment of the present invention. Integrated circuit 101, which in one preferred embodiment is a microprocessor, includes temperature sensor 103, which provides on-die thermal monitoring to measure the temperature of the die directly. There are a variety of approaches known in the art that can be used to implement a temperature sensor to directly measure the die temperature. For example, it is well known to use the voltage across a diode junction as an indication of temperature. In order to avoid temperature calibration for such a sensor, one approach supplies two different voltages to the diode and the difference in the two voltages measured indicates the temperature of the diode junction.

The temperature measurement, regardless of the type of temperature sensor, is compared to temperature limit values from registers 105 in compare logic 107. The compare logic determines if the measured temperature is above or below thresholds established in limit registers 105. Based on that comparison, processor output terminals 112 and 114 are driven to indicate the needed system action to be taken such as activating or deactivating a cooling device 109.

One of the limit values may be a panic limit value indicating a threshold temperature for safe processor operation. If the panic limit value is exceeded by the measured temperature, TPANIC output terminal 112 is asserted. Another of the output terminals, TALERT output terminal 114, may be used in several modes as explained further herein to provide thermal control information.

Figure 2:
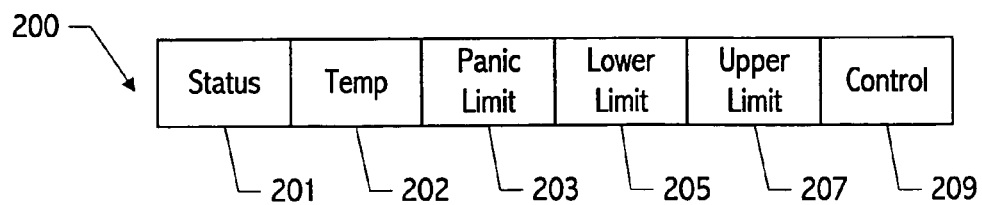
FIG. 2 illustrates an exemplary address block utilized in an embodiment of the present invention, to provide status, control, and temperature limit values.

In an embodiment, various limit values and control functions can be programmably controlled in the microprocessor. Referring to FIG. 2, an exemplary address block 200 is illustrated that provides registers used for the various functions associated with the thermal control functions described herein. Note that while address block 200 may be implemented as a plurality of contiguous bytes, each of the described fields may be independently addressable. In one implementation each of the illustrated fields is byte length.

Referring to FIGS. 1 and 2, temperature sensor 103 provides the current temperature measurement which, in one implementation, is expressed as an unsigned 7-bit value to temperature field 202 in address block 200. That register may be read by the processor to determine the current temperature indicated by temperature sensor 103.

Register 203 stores a programmable panic limit, which indicates a safe limit of operation. In one embodiment, the panic limit is implemented as a seven bit unsigned number and is preferably implemented as a read/write field. Operating the processor above the panic limit risks thermal damage to the processor. Thus, output terminal TPANIC 112 is asserted when compare logic 107 indicates the current temperature has exceeded the safe limit of safe operation. Assertion of TPANIC output terminal 112 should activate hardware and/or software to take immediate and possibly drastic actions to avoid thermal damage to the processor. For example, TPANIC may be used to drive an interrupt or may be connected directly to a cooling device. TPANIC may also be used to shut down the power supply to avoid potential damage, if necessary. Once asserted, TPANIC can be cleared by writing (or otherwise accessing) a control bit in the processor.

Registers 205 and 207 store, respectively a lower limit temperature value and an upper limit temperature value. In one embodiment, each limit value is implemented as a seven bit unsigned number. The measured temperature value from temperature sensor 103 is compared to the upper and lower limit values that are written to registers 205 and 207. The comparison result is used to drive the output terminal TALERT 114. As previously mentioned, TALERT output terminal 114 can operate in several modes, a "thermostat" mode and an "interrupt" mode.

In thermostat mode, TALERT is asserted when the die temperature as measured by temperature sensor 103, rises above the upper limit value in register 207 and is deasserted when die temperature falls below the lower limit value defined in lower limit register 205. In thermostat mode, TALERT can be used to control a cooling fan or other cooling device, much like the thermostat in a building turns the air conditioning on and off to maintain the room temperature within an appropriate range.

In interrupt mode, TALERT is asserted when the die temperature rises above the upper limit value specified in upper limit register 207 and is de-asserted when software writes a control bit described further herein. In interrupt mode, TALERT may be used as a hardware interrupt signal. In response to assertion of TALERT, an interrupt service routine activates a cooling device as needed. The same service routine would be responsible for accessing a location, e.g., writing a register bit, that deasserts TALERT and its hardware interrupt.

A status field is supplied in 201 that supplies the status of both TALERT and TPANIC (one bit each), i.e., whether the respective output terminal is asserted. Note that the panic limit and lower and upper limit registers are shown generically as temperature limit registers 105 in FIG. 1.

Address block 200 also includes control register 209, which has 8 control bits used in compare logic 107 to control the function of TALERT and TPANIC output terminals. The control bits are illustrated in more detail in FIG. 3. While not specifically illustrated, compare logic 107 or logic associated therewith is assumed to have the necessary control logic to provide the control functions defined in control byte 209. The individual bits of control register 209 will now be described.

Figure 3:
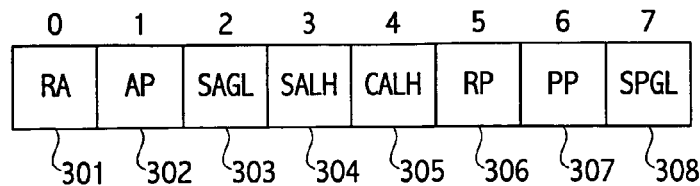
FIG. 3 illustrates an exemplary control byte showing the control functions used in an embodiment of the invention.

Five bits of control register 209 are used to control TALERT output terminal 114. Referring to FIG. 3, the set alert when temperature is greater than the upper limit (SAGL) bit 303, when set, causes TALERT to be asserted when the measured temperature exceeds the upper limit value written into the upper limit register 207. The clear TALERT when temperature is less than lower limit (CALH) bit, 305, when set, causes the TALERT terminal to clear when the measured temperature falls below the lower limit value in lower limit register 205. The setting of CALH bit 305, in conjunction with the setting of the SAGL bit 303, causes TALERT to operate in thermostat mode. If CALH bit 305 is not set and SAGL bit 303 is set, TALERT operates in interrupt mode. The reset alert (RA) bit 301 is the control bit that is written when TALERT is used in interrupt mode to deassert TALERT. The alert polarity bit (AP) 302 specifies whether the TALERT output terminal is active high or low.

In one embodiment, control logic can be programmed so TALERT is asserted when the measured temperature falls below a programmed value rather than rises above a programmed value. Thus, in an example of such an embodiment, the set alert when temperature is less than the lower limit (SALH) bit 304, when set, causes TALERT to be asserted when the measured temperature is less than the lower limit in lower limit register 205. In such an embodiment, TALERT could be used to inhibit a fan (or other cooling device) when asserted, since the processor temperature is at a safe level. Using TALERT to inhibit cooling provides assurance that the cooling device is operating during boot-up prior to programming of the control register. In addition, if a "hang" occurs on boot-up and the registers are never programmed, the cooling device(s) are operating and the system is not at risk.

Three control bits in the illustrated embodiment are used to control operation of TPANIC output terminal 112. The set TPANIC when temperature is greater than the panic limit (SPGL) bit 308 enables operation of the TPANIC output terminal. As previously mentioned, once TPANIC output terminal 112 is asserted, accessing (e.g., writing) a control location such as the Reset Panic (RP) 306 bit can be used to reset the TPANIC output terminal 112. The TPANIC polarity bit 307 determines the polarity of an asserted TPANIC signal.

In an embodiment of the invention, all of the features can be disabled by resetting or not setting the appropriate control bit. Thus, in such an embodiment, if not intentionally enabled, the TALERT and TPANIC capability remains inactive. Thus, a processor according to an embodiment of the invention, can function in old system boards without design modifications.

The registers, bytes and/or bits used to monitor and control the thermal capabilities described herein may be mapped into processor input/output space at an offset from an I/O location set in a model specific register (MSR). In that way, it should be possible for the basic input/output system (BIOS) to map the thermal register(s) in a manner that does not interfere with other I/O devices or require new hardware to be added to system designs. Likewise, the BIOS should be able to re-map other I/O devices so they do not interfere with the chosen addresses for the thermal registers. Thus, in one embodiment, the ability is given to access the thermal registers through mapped I/O space in a way that does not interfere with other system I/O devices or require new hardware to be added to system designs. Alternatively, the registers containing the thermal control and status information shown in FIGS. 2 and 3 may reside in one or more model specific registers, whose access may be restricted to software having the appropriate privilege level.

Figure 4:
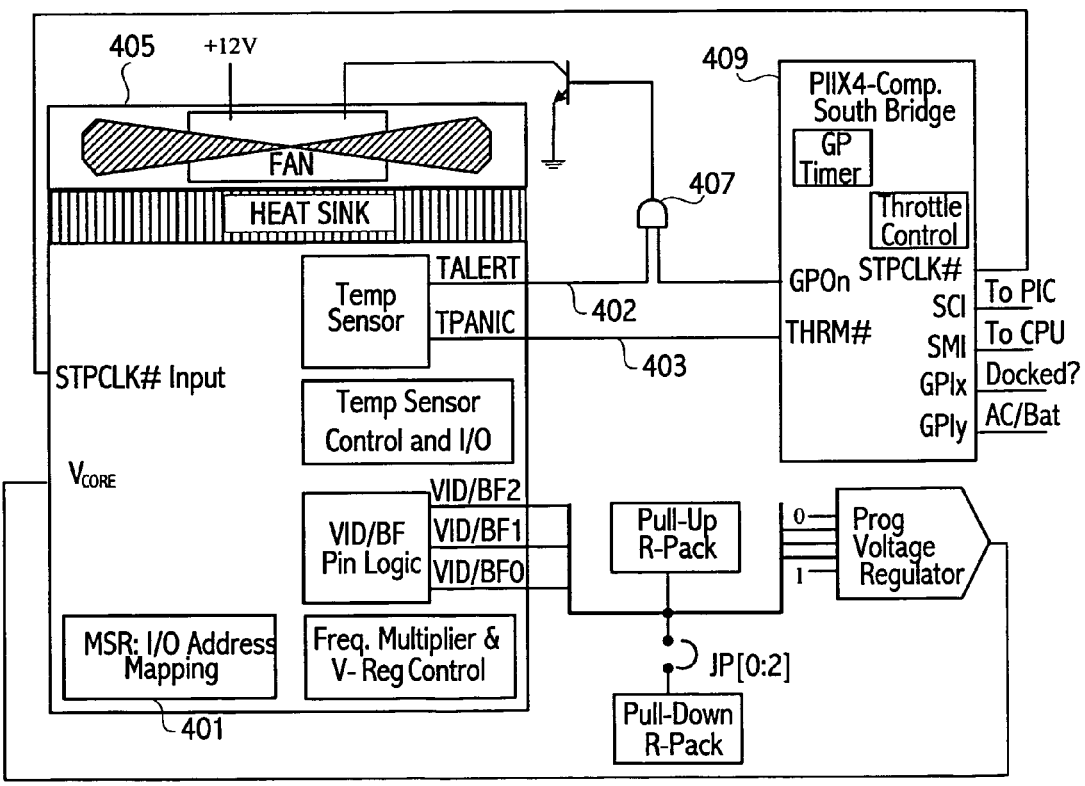
FIG. 4 illustrates an exemplary system incorporating an embodiment of the present invention.

Referring to FIG. 4, an exemplary mobile system incorporating an embodiment of the present invention is illustrated. Processor 401 supplies TALERT output signal 402, which is coupled to directly control the speed of fan 405 through AND gate 407. A PIIX4 compatible input/output integrated circuit 409, known in the art as a South Bridge, receives the TPANIC alert 403 and performs an appropriate thermal failsafe action, e.g., stopping processor operations, if necessary, to safeguard the system when the TPANIC alert 403 is asserted. AND gate 407 also receives a general purpose output (GPOn) control from South Bridge 409, which can be used to enable direct control by processor 401 of fan 405. South Bridge 409 performs other power management functions in the system, known in the art, which are not necessary for understanding of the present invention and thus are not described herein. In operation, BIOS post code can set the I/O address(es) for the thermal logic and setup the appropriate thermal management mode. In one embodiment, Advanced Configuration and Power Interface (ACPI) software, which enables the operating system to control the power management functions within the system, can be used to monitor die temperature. In a passive cooling mode, ACPI can throttle processor operations, i.e., reduce effective clock frequency using the STPCLK# input in response to die temperature. In active cooling modes fan 405 can be controlled directly by TALERT 402 as illustrated.

Thus, an on-board temperature sensor system has been described that provides more accurate and simpler thermal control functions. The ability to locate the sensor and the thermal registers (including the limit and control registers) on the processor and making the thermal control registers readily accessible to software operating on the processor, such as software implementing ACPI, simplifies thermal management of the computer system and provides more flexible thermal management capabilities.

The description of the invention set forth herein is illustrative, and is not intended to limit the scope of the invention as set forth in the following claims. For instance, the temperature logic, while described with relation to a processor, may be implemented on other integrated circuits. Further, the control registers may be implemented in a variety of manners as would be known to one of skill in the art. Some or all of the temperature control functions described herein may be implemented in a particular design based on system requirements. Note also that numerous variations of on-chip thermal sensors are known in the art. All such variations are included within the spirit and scope of the present invention. Other variations and modifications of the embodiments disclosed herein, may be made based on the description set forth herein, without departing from the scope and spirit of the invention as set forth in the following claims.

What is claimed is:

1. An integrated circuit comprising:
a temperature sensor providing a temperature measurement of the integrated circuit;
a programmable storage location storing a first temperature limit value, the programmable storage location accessible via an instruction executed by the integrated circuit; and
compare logic coupled to the temperature sensor and the storage location to provide an indication of a comparison between the temperature measurement and the first temperature limit value,
wherein the integrated circuit asserts a first temperature control signal which is supplied on a first output terminal of the integrated circuit when the temperature measurement is above the first temperature limit value; and
wherein the instruction is assigned a privilege level sufficient to access the programmable storage location.

2. The integrated circuit as recited in claim 1 wherein the integrated circuit deasserts the first temperature control signal, which is supplied on the first output terminal of the integrated circuit, when the temperature measurement indicated by the temperature sensor falls below a programmable second temperature limit value.

3. The integrated circuit as recited in claim 1 wherein the integrated circuit deasserts the first temperature control signal, which is supplied on the first output terminal of the integrated circuit, according to a programmable mode of operation that includes at least one of deasserting when the temperature measurement falls below a programmable second temperature limit value and deasserting when a control location in the integrated circuit is accessed.

4. The integrated circuit as recited in claim 1 wherein the first temperature limit value is a panic value indicating a temperature limit for safe integrated circuit operation.

5. The integrated circuit as recited in claim 1 further comprising an addressable storage location coupled to the temperature sensor, the addressable storage location accessible by an instruction executed by the integrated circuit and supplying an indication of the temperature measurement on the integrated circuit.

6. The integrated circuit as recited in claim 1 further comprising:
a second output terminal coupled to provide external to the integrated circuit an asserted signal when the temperature measurement indicated by the temperature sensor is above a second temperature limit value.

7. The integrated circuit as recited in claim 6 further comprising:
a second storage location supplying the second temperature limit value; and
second compare logic coupled to the second storage location and coupled to receive the temperature measurement of the integrated circuit, and wherein the second compare logic generates a second indication of when the temperature measurement of the integrated circuit is above the second temperature limit value.

8. The integrated circuit as recited in claim 7 further comprising:
a third storage location supplying a third temperature limit value;
third compare logic coupled to the third storage location and coupled to receive the temperature measurement, and wherein the compare logic generates a third indication that the temperature measurement of the integrated circuit is below the third temperature limit value.

9. The integrated circuit as recited in claim 8 wherein the integrated circuit asserts a first temperature control signal which is supplied on a first output terminal of the integrated circuit when the temperature measurement indicated by the temperature sensor is below the third temperature limit value.

10. The integrated circuit as recited in claim 1 wherein the integrated circuit is a microprocessor.

11. An integrated circuit comprising
  a temperature sensor providing a temperature measurement of the integrated circuit;
  a programmable storage location storing a first temperature limit value, the programmable storage location accessible via an instruction executed by the integrated circuit; and
  compare logic coupled to the temperature sensor and the storage location to provide an indication of a comparison between the temperature measurement and the first temperature limit value,
  wherein the integrated circuit asserts a first temperature control signal which is supplied on a first output terminal of the integrated circuit when the temperature measurement is above the first temperature limit value; and
  wherein a BIOS includes the instruction.

12. The integrated circuit of claim 11 further comprising the BIOS executable to set addresses for the compare logic and to map the programmable storage location to an input/output space.

* * * * *